(12) United States Patent
Han

(10) Patent No.: US 9,991,477 B2
(45) Date of Patent: Jun. 5, 2018

(54) MASK FRAME ASSEMBLY, A METHOD OF MANUFACTURING THE SAME, AND A METHOD OF MANUFACTURING A DISPLAY APPARATUS

(71) Applicant: Samsung Display Co., Ltd., Yongin-si (KR)

(72) Inventor: Jeongwon Han, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1 day.

(21) Appl. No.: 14/960,790

(22) Filed: Dec. 7, 2015

(65) Prior Publication Data

US 2016/0315292 A1    Oct. 27, 2016

(30) Foreign Application Priority Data

Apr. 23, 2015    (KR) .................... 10-2015-0057533

(51) Int. Cl.
*H01L 51/56* (2006.01)
*C23C 16/04* (2006.01)

(52) U.S. Cl.
CPC .......... *H01L 51/56* (2013.01); *C23C 16/042* (2013.01)

(58) Field of Classification Search
CPC ............. H01L 51/56; H01L 51/0091; H01L 21/67359; C23C 16/042; C23C 16/00591; G06K 2209/01; G06K 9/00442; G06K 9/00456; G06K 9/00463; G06K 9/2054; G03F 1/00

USPC ........................................... 257/88
See application file for complete search history.

(56) References Cited

U.S. PATENT DOCUMENTS

2014/0150721 A1* 6/2014 Oh .................... C23C 14/042
                                                    118/504

FOREIGN PATENT DOCUMENTS

| KR | 10-2003-0069679 | 8/2003 |
| KR | 10-2003-0085188 | 11/2003 |
| KR | 10-2005-0035561 | 4/2005 |
| KR | 10-2008-0038650 | 5/2008 |
| KR | 10-2008-0054510 | 6/2008 |
| KR | 10-2009-0053417 | 5/2009 |
| KR | 10-2009-0105614 | 10/2009 |
| KR | 10-2010-0000128 | 1/2010 |
| KR | 10-2011-0080049 | 7/2011 |
| KR | 10-2011-0128579 | 11/2011 |
| KR | 10-2013-0129544 | 11/2013 |

* cited by examiner

*Primary Examiner* — Julio J Maldonado
*Assistant Examiner* — Stanetta Isaac
(74) *Attorney, Agent, or Firm* — H.C. Park & Associates, PLC

(57) ABSTRACT

A mask frame assembly including a frame and a mask having a first surface that contacts the frame. The mask includes an active area and pattern holes formed in the active area, the pattern holes being configured to allow a deposition material to pass through the mask. The mask also includes a rib portion disposed outside the active area and configured to block the deposition material from passing through the mask and a non-magnetic reinforcing member disposed on a part of the rib portion.

13 Claims, 6 Drawing Sheets

MASK FRAME ASSEMBLY, A METHOD OF MANUFACTURING THE SAME, AND A METHOD OF MANUFACTURING A DISPLAY APPARATUS

CROSS-REFERENCE TO RELATED APPLICATION

This application claims priority from and the benefit of Korean Patent Application No. 10-2015-0057533, filed on Apr. 23, 2015, which is hereby incorporated by reference for all purposes as if fully set forth herein.

BACKGROUND

Field

Exemplary embodiments relate to a mask frame assembly, a method of manufacturing the same, and a method of manufacturing a display apparatus.

Discussion of the Background

Many researchers consider organic light-emitting diode (OLED) display (e.g., flat-panel OLED display) as the next-generation display due to its wide viewing angle, high contrast ratio, low driving voltage, light and thin design, and fast response time.

Light-emitting devices are classified into inorganic light-emitting devices and organic light-emitting devices according to materials used to form emission layers. Since organic light-emitting devices have a higher brightness and a faster response time than inorganic light-emitting devices and may realize color display, the organic light-emitting devices have been actively studied in recent years.

Typical manufacture of an organic light-emitting display may include forming on an organic film and/or an electrode via vacuum deposition. However, using typical manufacturing techniques when manufacturing high-resolution organic light emitting displays may result in a low quality organic light emitting display with a large shadow effect (i.e., unintended excessive shadowing due to high-incident-angle molecules relative the normal angle).

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include a mask frame assembly, a method of manufacturing the same, and a method of manufacturing a display.

Additional aspects will be set forth in part in the description which follows, and, in part, will be apparent from the disclosure, or may be learned by practice of the inventive concept.

An exemplary embodiment discloses a mask frame assembly including a frame and a mask having a first surface that contacts the frame. The mask includes an active area and pattern holes formed in the active area, the pattern holes being configured to allow a deposition material to pass through the mask. The mask also includes a rib portion disposed outside the active area and configured to block the deposition material from passing through the mask and a non-magnetic reinforcing member disposed on a part of the rib portion.

An exemplary embodiment also discloses a method of manufacturing a mask frame assembly. The method includes forming pattern holes in an active area of a mask, forming at least one of reinforcing holes and reinforcing grooves outside the active area of the mask, injecting a non-magnetic reinforcing member into the at least one of the reinforcing holes and the reinforcing grooves, and providing the mask on a frame over an opening in the frame. The pattern holes are configured to allow a deposition material to pass through the mask and the at least one of the reinforcing holes and the reinforcing grooves define a rib portion that is configured to block a transmission of the deposition material.

An exemplary embodiment also discloses a method of manufacturing a display. The method includes depositing at least one of an organic film and a second electrode by using a mask frame assembly. The mask frame assembly includes a mask including pattern holes formed in an active area of the mask and configured to allow a deposition material to pass through the mask, a rib portion disposed outside the active area and configured to block a transmission of the deposition material, and a non-magnetic reinforcing member that is formed on at least a part of the rib portion. The mask frame assembly also includes a frame including an opening in a central portion of the frame and through which the deposition material passes and configured to support two ends of the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
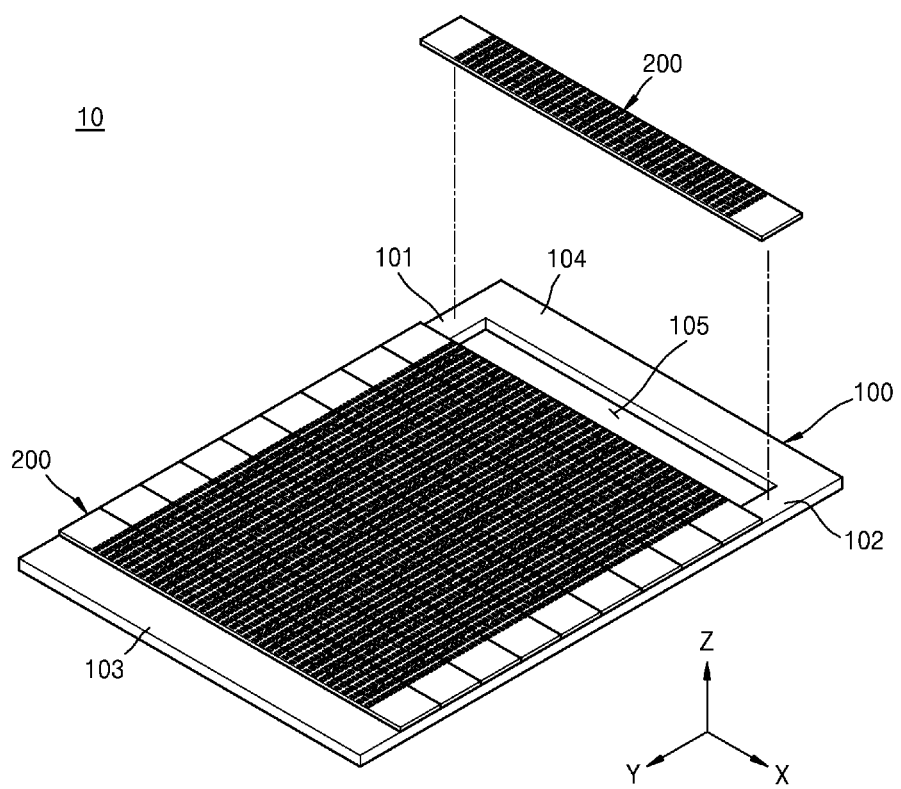
FIG. 1 is an exploded perspective view of a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
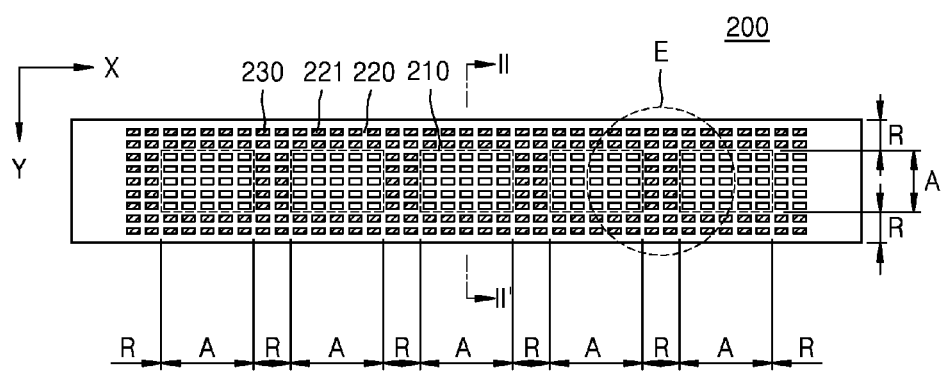
FIG. 2 is a plan view of a mask of FIG. 1.
Figure 3:
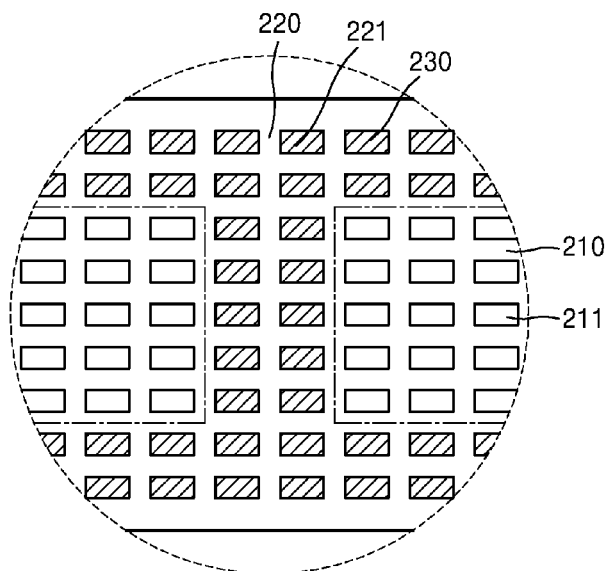
FIG. 3 is an enlarged view of a portion E of FIG. 2.

FIG. 1 is an exploded perspective view of a mask frame assembly 10 according to an exemplary embodiment. FIG. 2 is a plan view of a mask 200 of FIG. 1. FIG. 3 is an enlarged view of a portion E of FIG. 2.

Referring to FIG. 1, the mask frame assembly 10 may include a frame 100 and the mask 200. The frame 100 and the mask 200 may be coupled to each other by various methods. In an exemplary embodiment, the frame 100 and the mask 200 may be coupled to each other by welding both ends of the mask 200 to the frame 100.

The frame 100 may include a first support portion 101, a second support portion 102, a third support portion 103, and a fourth support portion 104. The first support portion 101 and the second support portion 102 may be spaced apart from each other such that the first support portion 101 and the second support portion 102 are substantially parallel in an X-axis direction. The third support portion 103 and the fourth support portion 104 may be spaced apart from each other such that the third support portion 103 and the fourth support portion 104 are substantially parallel in a Y-axis direction.

The first support portion 101 and the second support portion 102 may form an outer frame of the mask frame assembly 10 by connecting to the third support portion 103 and the fourth support portion 104. Although FIG. 1 illustrates one opening 105 having a rectangular shape may be formed in a central portion of the frame 100 in FIG. 1, exemplary embodiments are not limited thereto. The opening 105 may have any of various shapes such as a circular shape, an elliptical shape, or a polygonal shape. The frame 100 may also have more than one opening 105. Also, the frame 100 may be formed from at least one of a metal and a synthetic resin.

The third support portion 103 and the fourth support portion 104 may be disposed to be parallel to the mask 200. In this case, since multiple masks 200 extend in a longitudinal direction of each of the third support portion 103 and the fourth support portion 104, the frame 100 may be formed of a material having a sufficient rigidity and having a predetermined elastic force.

Referring to FIG. 2, the mask 200 may be a stick-type mask. The mask 200 may include an active area 210 through which a deposition material passes. The mask 200 may include a rib portion 220 that is formed outside the active area 210 and blocks transmission of the deposition material.

The mask 200 may also include a reinforcing member 230 that is formed on at least a part of the rib portion 220 and is non-magnetic.

Referring to FIG. 3, pattern holes 211 may be formed in the active area 210 of the mask 200. During a deposition process, a deposition material that passes through the pattern holes 211 may be deposited on a substrate (not shown), and thus, a deposition area may be defined on the substrate by the active area 210 and the pattern holes 211 of the active area.

The mask 200 may be a magnetic thin film. The magnetic thin film may be formed of nickel or a nickel alloy. For example, the mask 200 may be formed of a nickel-cobalt alloy, which has excellent surface roughness characteristics and by which fine patterns may be easily formed.

The mask 200 may be manufactured by using an etching method. The mask 200 may be manufactured by forming a photoresist layer having the same pattern as each of the pattern holes 211 on a thin film by using a photoresist or by attaching a film having patterns of the pattern holes 211 to a thin film and etching the thin film. The mask 200 may be manufactured by using electroforming or electro-less plating.

Although FIGS. 1, 2, and 3 illustrate the pattern holes 211 having a rectangular shape to form a masking pattern on the active area 210, exemplary embodiments are not limited thereto. In other words, the number, positions, and shapes of the pattern holes 211 of FIGS. 1, 2, and 3 may be of any suitable number, position, and shape. For example, each pattern hole may have a dot shape. In other examples, a masking pattern that is entirely opened may be formed on the active area 210 or a masking pattern having a stripe shape may be formed on the active area 210. For ease of reference and not by way of limitation, the mask 200 will be described as including five active areas 210 and 25 pattern holes 211 are formed in each of the five active areas 210.

Although not shown, the mask 200 may be formed as one large member. In this case, since warpage due to the weight of the mask 200 may become severe, the mask 200 may be manufactured as a multiple stick-type members, as shown in FIGS. 1, 2, and 3. Although FIG. 1 is an exploded perspective view illustrating one mask 200, for ease of reference, the masks 200 may be disposed to cover the entire opening 105 after a manufacturing process is completed. For ease of reference, the mask 200 will be described as stick-type members, as shown in FIG. 1.

Referring to FIGS. 2 and 3, the rib portion 220 disposed outside the active area 210 (i.e., the non-active area R) in the mask 200 may prevent a deposition material from passing through the mask 200 in the rib portion 220 and reaching the substrate. Reinforcing holes 221 may have a similar cross-sections (or shape) as the pattern holes 211 of the active area 210. The reinforcing holes 221 may be formed in the rib portion 220. The reinforcing holes 221 may be formed to pass through the mask 200, like the pattern holes 211, and the reinforcing member 230 may be injected into the reinforcing holes 221.

Referring to FIG. 3, the reinforcing member 230 may be formed in the reinforcing holes 221 that are hatched. The pattern holes 211 of the active area 210 that are not hatched are formed to pass through the mask 200.

Reinforcing members 230, 230a, and 230b that are formed in the reinforcing holes 221 of the rib portion 220 according to various exemplary embodiments will now be described in detail with reference to FIGS. 4, 5, and 6.

Figure 4:
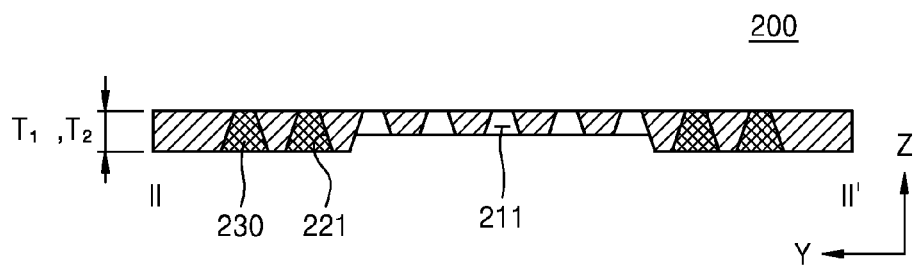
FIG. 4 is a cross-sectional view of the mask taken along line II-II' of FIG. 2.

FIG. 4 is a cross-sectional view of the mask 200 taken along sectional line II-IF of FIG. 2. FIGS. 5 and 6 are cross-sectional views of FIG. 4 according to other exemplary embodiments.

Figure 5:
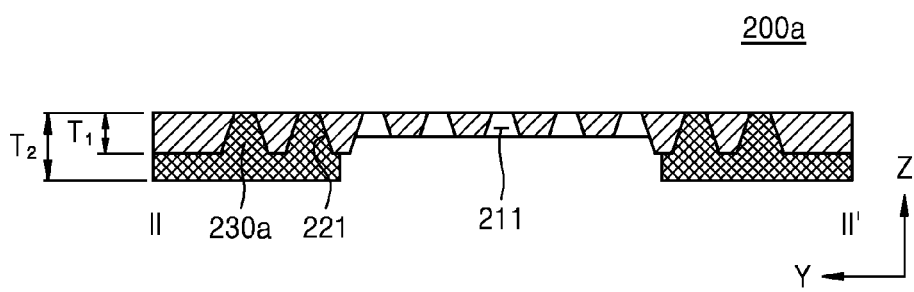
FIG. 5 and FIG. 6 are cross-sectional views of FIG. 4 according to exemplary embodiments.
Figure 6:
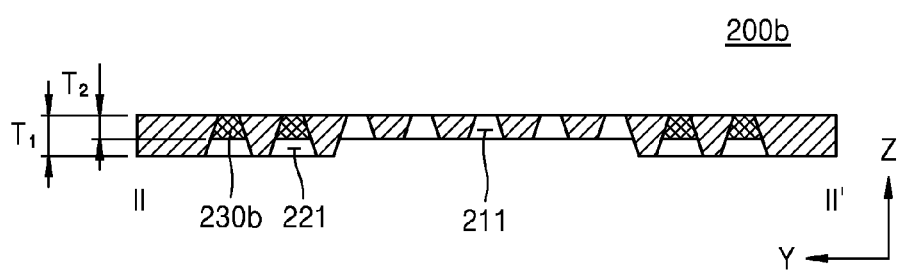

Referring to FIGS. 4, 5, and 6, the reinforcing members 230, 230a, and 230b may each be formed of a non-magnetic material. As shown in FIG. 4, the reinforcing member 230 may be formed to have a thickness $T_2$ that is equal to the depth $T_1$ of the reinforcing holes 221. As shown in FIG. 5, the reinforcing member 230a may be formed to have a thickness $T_2$ that is greater than the depth $T_1$ of the reinforcing holes 221. As shown in FIG. 6, the reinforcing member 230b may be formed to have a thickness $T_2$ that is less that the depth of $T_1$ of the reinforcing holes 221.

The reinforcing members 230, 230a, and 230b may have various shapes. The reinforcing members 230, 230a, and 230b may have various thicknesses $T_2$. The thicknesses $T_2$ of the reinforcing members 230, 230a, and 230b may be changed in various ways during processes of manufacturing masks 200, 200a, and 200b. In particular, the thicknesses $T_2$ of the reinforcing members 230, 230a, and 230b may be changed when preparing a deposition process based by using an electrostatic chuck to adhere the masks 200, 200a, and 200b to the substrate. During this preparation process, the thicknesses $T_2$ may be altered depending on factors such as rigidities of the masks 200, 200a, and 200b and a magnetic force applied to the masks 200, 200a, and 200b.

Because the reinforcing members 230, 230a, or 230b are injected into the reinforcing holes 221 to close the reinforcing holes 221, a deposition material sprayed to the rib portion 220 is prevented from reaching the substrate because the deposition material does not pass through the rib portion 220. In other words, a deposition material that is sprayed from a deposition source toward the mask 200 may be deposited on the substrate only through the pattern holes 211 of the active area 210 and a deposition material sprayed toward the rib portion 220 may be completely blocked by the rib portion 220.

The pattern holes 211 and the reinforcing holes 221 may be manufactured by using electroplating or electro-less plating. More specifically, a photoresist PR may be coated on a base substrate (not shown) and exposure and development may be performed by using a photomask. Patterns are formed on a photoresist layer and grooves are formed between photoresist patterns during the development. In this state, the grooves are filled by using electroforming plating or electro-less plating. The photoresist patterns are removed, thereby simultaneously forming the pattern holes 211 and the reinforcing holes 221 over an entire surface of the mask 200.

After the mask 200, 200a, 200b, including the pattern holes 211 and the reinforcing holes 221, is prepared, the reinforcing member 230, 230a, or 230b may be injected into the reinforcing holes 221. The reinforcing member 230, 230a, or 230b may be injected into the reinforcing holes 221 that are formed in the rib portion 220, to increase a rigidity of the mask 200.

If the reinforcing holes 221 are not formed in the rib portion 220, the rib portion 220 is entirely formed of a magnetic material that is used to form the mask 200. More specifically, the mask 200 is formed of a material such as nickel or a nickel-cobalt alloy. Since the material has a relatively high weight, if multiple stick-type masks 200 are formed on the frame 100, the masks 200 may be warped due to their weights.

In this case, a gap is formed between each of the masks 200 and the substrate (not shown) that needs to be adhered during a deposition process in order to improve the precision of the deposition process may be formed. Thus a shadow effect, in which a deposition material is deposited on an undesired area, may occur.

When the rib portion 220 is entirely formed of a magnetic material used to form the mask 200, there is a great difference of a volume of a magnetic material between the active area 210 and the rib portion 220 at a boundary portion between the active area 210 and the rib portion 220. Due to the great difference of the volume of the magnetic material between the active area 210 and the rib portion 220, when the mask 200 is adhered to the substrate by using an electrostatic chuck (not shown) during a deposition process, a repulsive force by which the mask 200 is pushed away from the substrate is formed at the boundary portion between the active area 210 and the rib portion 220. Once the electrostatic chuck pushes the mask 200, instead of pulling the mask 200 toward the substrate, a gap is formed between the mask 200 and the substrate and a shadow effect occurs as described above.

However, when the reinforcing holes 221 are formed in the rib portion 220 and non-magnetic reinforcing member 230, 230a, or 230b may be injected into the reinforcing holes 221, the rib portion 220 may prevent a deposition material from reaching the substrate during a deposition process, a rigidity of the mask 200 that may be reduced due to the reinforcing holes 221 may be maintained, and a repulsive force that is formed at a boundary between the active area 210 and the rib portion 220 may be removed, thereby making it possible to adhere the mask 200 to the substrate.

In detail, when the reinforcing member 230 is formed of a non-magnetic material and is injected into the reinforcing holes 221, a magnetic force applied between the substrate and the mask 200 may be uniformly formed. More specifically, shapes and sizes of the reinforcing holes 221 that are formed in the rib portion 220 may be substantially the same as those of the pattern holes 211 that are formed in the active area 210. In this case, since a magnetic material is uniformly formed on the entire surface of the mask 200 to have repeated patterns, a magnetic force is uniformly applied to the entire surface of the mask 200.

Next, the rib portion 220 of FIGS. 4, 5, and 6 according to other exemplary embodiments will be explained with reference to FIGS. 7, 8, 9, 10, and 11.

Figure 7:
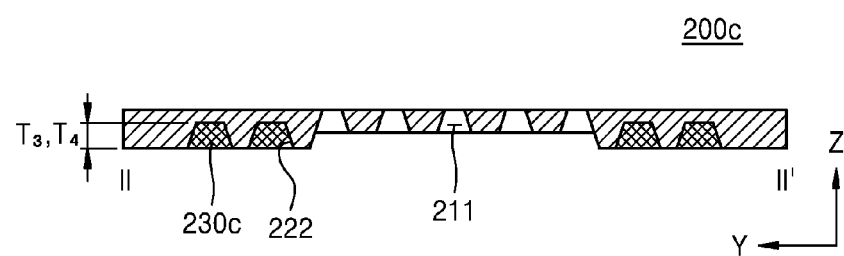
FIG. 7 is a cross-sectional view illustrating a case where pattern grooves are formed in a rib portion of the mask of FIG. 4.

FIG. 7 is a cross-sectional view illustrating a case where pattern holes are formed in the rib portion 220 of the mask 200 of FIG. 4. FIGS. 8, 9, 10, and 11 are cross-sectional views of FIG. 7 according to other exemplary embodiments.

Referring to FIG. 7, reinforcing grooves 222 may be formed in the rib portion 220 of a mask 200c. The reinforcing grooves 222 may have a predetermined depth in the rib portion 220 of the mask 200c, unlike the reinforcing holes 221 of FIGS. 4, 5, and 6 that pass through the mask 200.

Figure 8:
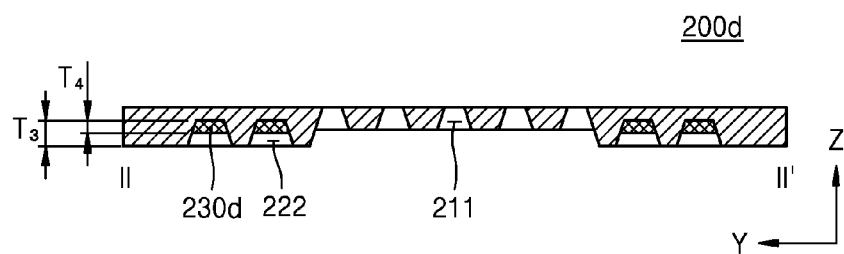
FIG. 8, FIG. 9, FIG. 10, and FIG. 11 are cross-sectional views of FIG. 7 according to exemplary embodiments.
Figure 9:
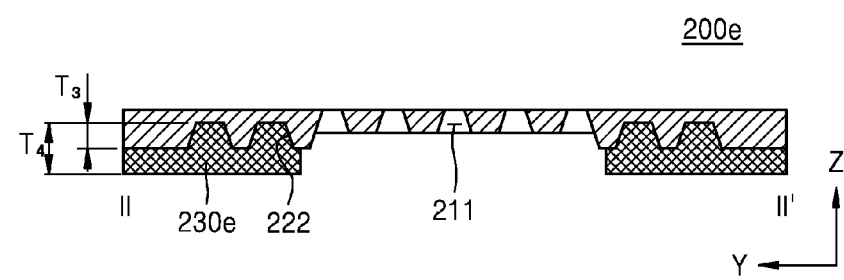
Figure 10:
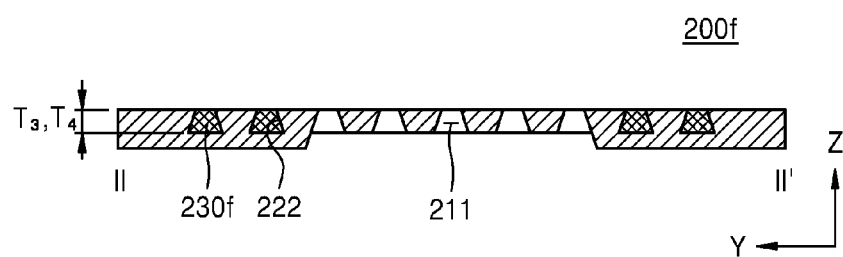
Figure 11:
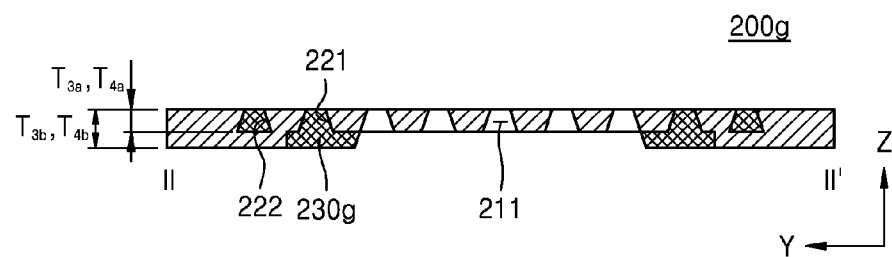

Reinforcing members 230c, 230d, 230e, 230f, and 230g may have various shapes and may be injected into reinforcing grooves 222. The reinforcing members 230c, 230d, 230e, 230f, and 230g may each be formed in at least one reinforcing groove 222 of the reinforcing grooves 222. The reinforcing members 230c, 230d, 230e, 230f, and 230g may each be formed in at least one surface of each of the masks 200c, 200d, 200e, 200f, and 200g that contacts the frame 100 and the other surface that faces the substrate. More specifically, FIGS. 7, 8, and 9 illustrate a case where the reinforcing grooves 222 are formed in one surface of each of the masks 200c, 200d, and 200e. FIGS. 10 and 11 illustrate a case where the reinforcing grooves 222 are formed in the other surface of each of the masks 200f and 200g. As shown in FIG. 11, the reinforcing holes 221 and the reinforcing grooves 222 may be simultaneously formed in one mask 200g. The reinforcing member 230g may be formed in each of the reinforcing holes 221 and the reinforcing grooves 222.

The reinforcing members 230c, 230d, 230e, 230f, and 230g that are each formed in the reinforcing grooves 222 may be formed to have various thicknesses $T_4$. As shown in FIG. 7, the reinforcing member 230c may be formed to have the thickness $T_4$ that is equal to the depth $T_3$ of the reinforcing grooves 222. As shown in FIG. 8, the reinforcing member 230d may be formed to have the thickness $T_4$ that is less than the depth $T_3$ of the reinforcing grooves 222. As shown in FIG. 9, the reinforcing member 230e may be formed to have the thickness $T_4$ that is greater than the depth $T_3$ of the reinforcing grooves 222.

Referring to FIG. 9, when the reinforcing member 230e is formed to have the thickness $T_4$ that is greater than the depth $T_3$ of the reinforcing grooves 222, the reinforcing grooves 222 may be formed in one surface of the mask 200e that contacts the frame 100. For example, the reinforcing grooves 222 may be formed in a bottom surface of the mask 200e.

If the reinforcing grooves 222 are formed in the other surface of the mask 200e that faces the substrate and a reinforcing member (not shown) is formed to have a thickness that is greater than a depth of the reinforcing grooves 222, the pattern holes 211 of the active area 210 may not be adhered to the substrate and may peel off by a distance corresponding to the thickness of the reinforcing member that protrudes toward the substrate from a surface of the mask 200e, thereby failing to prevent a shadow effect.

Accordingly, as shown in FIG. 10, when the reinforcing grooves 222 are formed in the other surface (i.e., the top surface) of the mask 200f, the reinforcing member 230f may be formed to have the thickness $T_4$ equal to the depth $T_3$ of the reinforcing grooves 222.

FIG. 11 illustrates the mask 200g including the rib portion 220 in which the reinforcing holes 221 and the reinforcing grooves 222 of FIGS. 4 and 10 are simultaneously formed as described above. More specifically, the reinforcing member 230g may be formed in at least a part of the rib portion 220 to have any of various shapes. As shown in FIG. 11, the reinforcing member 230g formed in the reinforcing grove 222 may have a thickness $T_{4a}$, which is equal to the depth $T_{3a}$ of the reinforcing groove. The reinforcing member 230g formed in the reinforcing hole 221 may have a thickness $T_{4b}$ that is equal to the depth $T_{3b}$ of the reinforcing hole 221. Although FIG. 11 illustrates the mask 200g including the rib portion 220 in which the reinforcing holes 221 and the reinforcing grooves 222 of FIGS. 4 and 10, the reinforcing member 230 may be formed in the rib portion 220 to have any of various shapes other than those of FIGS. 4, 5, 6, 7, 8, 9, 10, and 11.

A method of manufacturing the mask frame assembly 10, according to an exemplary embodiment, will now be explained.

The method of manufacturing the mask frame assembly 10 including the frame 100 and the mask 200 having one surface that contacts the frame 100 and the other surface that faces a substrate (not shown) may include various method steps. The method may include forming at least one of the pattern holes 211. A deposition material may pass through the pattern hole 211. The method may include forming reinforcing holes 221 that pass through the mask 200 in the rib portion 220 of the mask 200. The method may include forming a reinforcing groove 222 in the rib portion 220 of the mask 200. The reinforcing groove 222 may have a predetermined depth. The method may include injecting a non-magnetic reinforcing member 230 into at least one of the reinforcing holes 221. The method may include injecting a non-magnetic reinforcing member 230 into at least one of the reinforcing grooves 222. The method may include disposing the mask 200 on the frame 100 in which the opening 105 is formed.

The pattern holes 211 may define an active area through which the deposition material passes. The reinforcing holes 221 and/or the reinforcing grooves 222 may define the rib portion 220 that blocks transmission of the deposition material.

The reinforcing member 230 may be formed of a paste-type material and may be injected into the reinforcing holes 221 and/or the reinforcing grooves 222. After the reinforcing member 230 is injected into the reinforcing holes 221 and/or the reinforcing grooves 222, the reinforcing member 230 may be cured (e.g., through ultra violet radiation, through heat, through a chemical reaction) to increase a rigidity of the mask 200. The reinforcing member 230 may be formed of a non-magnetic material, such as a synthetic resin and/or an epoxy resin.

The mask 200 may be fixed to the substrate by using a device having a magnetic force, such as an electrostatic chuck (not shown). In order to prevent peeling-off or warpage between the substrate and the mask 200, a constant magnetic force may be applied between the substrate and the mask 200.

When the reinforcing member 230 is formed of a non-magnetic material, a magnetic force may be uniformly applied between the substrate and the mask 200. The pattern holes 211 and the reinforcing holes 221 that are formed in the mask 200 may be formed to have substantially the same cross-sectional shape. In other words, the pattern holes 211 and the reinforcing holes 221 that are formed by using electroforming plating or electro-less plating may be uniformly distributed over the entire surface of the mask 200. Since a portion of the mask 200, to which a magnetic force is applied, is formed to have repeated patterns, the magnetic force may be uniformly applied to the mask 200.

The mask 200 may be fixed to the frame 100 by welding. In this case, the mask 200 may extend in a longitudinal direction and then both ends of the mask 200 may be welded to the frame 100, thereby minimizing warpage due to the weight of the mask 200.

When the mask 200 is manufactured by general electroforming, a base metal is melted and then flowed in a portion other than patterns through which a deposition material passes. The mask 200 is manufactured by melting a base metal by using electroplating or electro-less plating and filling the melted base metal in a portion other than patterns through which a deposition material passes.

A portion of the mask 200 where the patterns are formed may have a different thickness than a portion of the mask 200 where no patterns are formed. This is because a rigidity of the mask 200 is reduced due to the existence of an element (e.g., the pattern holes 211) which passes through the mask 200. An outer portion of the mask 200 (i.e., where the pattern holes 211 are not formed) may be formed to be thicker than an inner portion of the mask 200 so that a rigidity of the mask 200 may be increased.

However, due to the thickness difference between the portion where the patterns are formed and the portion where no patterns are formed, when the mask 200 and the substrate are fixed to each other by using a magnetic force, an intensity of a magnetic force applied to the entire surface of the mask 200 may vary according to the portions of the mask 200. Thus, local peeling-off may occur between the substrate and the mask 200. Once the mask 200 fails to be adhered to the substrate and peels off from the substrate, the risk of a shadow effect is increased during a deposition process, as described above.

In the mask frame assembly 10 according to exemplary embodiments, since the pattern holes 211 and the reinforcing holes 221 and/or the reinforcing grooves 222 may be formed in the entire surface of the mask 200, a magnetic force applied to the mask 200 may be uniformly distributed and peeling-off between the substrate and the mask 200 may be reduced.

A rigidity of the mask 200 that may be reduced due to the existence of the reinforcing holes 221 and/or the reinforcing grooves 222. However, the rigidity of the mask may be increased by forming the reinforcing member 230 in the reinforcing holes 221 and/or the reinforcing grooves 222.

Figure 12:
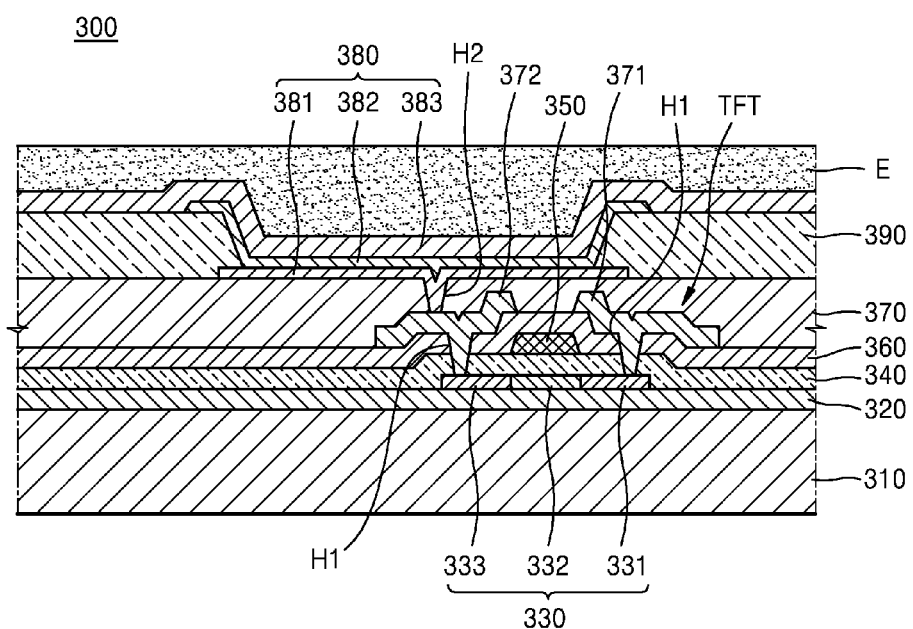
FIG. 12 is a cross-sectional view of a display apparatus manufactured by using the mask frame assembly of FIG. 1.

FIG. 12 is a cross-sectional view of a display 300 manufactured by using the mask frame assembly 10 of FIG. 1.

Referring to FIG. 12, the display 300 may include a substrate 310 and a display unit (not shown). Also, the display 300 may include a thin-film encapsulation film E or an encapsulation substrate (not shown) that is formed on the display unit. In this case, the encapsulation substrate may be the same as or similar to that used in a general display. Thus, for brevity, a detailed explanation of the encapsulation substrate will not be given. Also, for ease of reference, the display 300 will be described as including the thin-film encapsulation layer E.

The display unit may be formed on the substrate 310. In this case, the display unit may include a thin-film transistor (TFT), a passivation film 370 may be formed to cover the TFT, and an organic light-emitting diode (OLED) device 380 may be formed on the passivation film 370.

In this case, the substrate 310 may include a glass material. However, the exemplary embodiments are not limited to the substrate 310 including a glass material. The substrate 310 may include a plastic material. The substrate may include a metal material such as stainless steel and/or titanium (Ti) or an alloy of stainless steel and/or titanium. Also, the substrate 310 may include polyimide (PI). For ease of reference, the display 300 will be described as including a substrate 310 including a glass material.

A buffer layer 320 may include an organic compound and/or an inorganic compound (e.g., $SiO_X$ ($X \geq 1$) or $SiN_X$ ($X \geq 1$)). The buffer layer 320 may be formed on a top surface of the substrate 310.

An active layer 330 may be arranged to have a predetermined pattern. The active layer 330 may be formed on the buffer layer 320. The active layer 330 may be covered by a gate insulating layer 340. The active layer 330 may include a source region 331, a drain region 333, and a channel region 322 that is formed between the source region 331 and the drain region 333.

The active layer 330 may include various materials. For example, the active layer 330 may include an inorganic semiconductor material, such as amorphous silicon or crystalline silicon. Alternatively, the active layer 330 may include an oxide semiconductor. Alternatively, the active layer 330 may include an organic semiconductor material. However, for ease of reference, the display 300 will be described as including an active layer 330 formed of amorphous silicon.

The active layer 330 may be formed by forming an amorphous silicon film on the buffer layer 320, crystallizing the amorphous silicon film into a polycrystalline silicon film, and patterning the polycrystalline silicon film. The source region 331 and the drain region 333 of the active layer 330 may be doped with impurities according to the particular TFT. For example, the particular doping used for the source region 331 and the drain region 333 may depend on whether the TFT is a driving TFT (not shown) or a switching TFT (not shown).

A gate electrode 350 that corresponds to the active layer 330 may be formed on the gate insulating layer 340. An interlayer insulating layer 360 may cover the gate electrode 350 and may be formed on a top surface of the gate insulating layer 340.

A contact hole H1 may be formed in the interlayer insulating layer 360 and the gate insulating layer 340 over the source region 331. An additional contact hole H1 may be formed in the interlayer insulating layer 360 and the gate insulating layer 340 over the drain region 333. A source electrode 371 and a drain electrode 372 are formed on the interlayer insulating layer 360 to respectively contact the source region 331 and the drain region 333 through the respective contact holes H1.

The passivation film 370 may be formed over the TFT, and a pixel electrode 381 of an organic light-emitting diode (OLED) device may be formed over the passivation film 370. The pixel electrode 381 may contact the drain electrode 372 of the TFT through a via hole H2 that is formed in the passivation film 370. The passivation film 370 may include an inorganic material and/or an organic material. The passivation film 370 may have either a single-layer structure or a multi-layer structure. The passivation film 370 may be formed as a planarization film having a flat top surface irrespective of a curved shape of a lower film that is disposed under the passivation film 370 or may be curved along the curved shape of the lower film. The passivation film 370 may include a transparent insulating material to achieve a resonance effect.

After the pixel electrode 381 is formed on the passivation film 370, a pixel-defining film 390 is formed to cover the pixel electrode 381 and the passivation film 370 and to allow the pixel electrode 381 to be exposed the pixel-defining film 390. The pixel-defining film 390 may include an organic material and/or an inorganic material.

An intermediate layer 382 and a counter electrode 383 may be formed on at least the pixel electrode 381. The intermediate layer 382 and the counter electrode 383 may be formed on a portion of the pixel-defining film 390.

The pixel electrode 381 may function as an anode and the counter electrode 383 may function as a cathode. Alternatively, the polarities of the pixel electrode 381 and the counter electrode 383 may be reversed.

The pixel electrode 381 and the counter electrode 383 may be insulated from each other by the intermediate layer 382. The pixel electrode 381 and the counter electrode 383 may apply voltages having different polarities to the intermediate layer 382 so that an organic emission layer emits light.

The intermediate layer 382 may include the organic emission layer. Alternatively, the intermediate layer 382 may include the organic emission layer, and may further include at least one of a hole injection layer (HIL), a hole transport layer (HTL), an electron transport layer (ETL), and an electron injection layer (EIL).

One unit pixel P may include multiple subpixels. The subpixels may emit light of various colors. For example, the subpixels may include subpixels R, G, and B that respectively emit red light, green light, and blue light (not shown). Alternatively, the subpixels (not shown) may emit red light, green light, blue light, and white light.

The thin-film encapsulation layer E may include inorganic layers, or an inorganic layer and an organic layer.

The organic layer of the thin-film encapsulation layer E may include a polymer. The organic layer of the thin-film encapsulation layer E may be a single film or a stacked film including at least one of polyethylene terephthalate, polyimide, polycarbonate, epoxy, polyethylene, and polyacrylate. The organic layer may include polyacrylate. More specifically, the organic layer may include a substance obtained by polymerizing a monomer composition including a diacrylate-based monomer and a triacrylate-based monomer. A monoacrylate-based monomer may be further included in the monomer composition. Also, a photoinitiator such as a trimethylbenzoyl diphenylphosphine oxide (TPO) may be further included in the monomer composition, but the present exemplary embodiment is not limited thereto.

The inorganic layer of the thin-film encapsulation layer E may be a single film or a stacked film. The inorganic layer may include a metal oxide and/or a metal nitride. More specifically, the inorganic layer may include at least one of $SiN_X$, $Al_2O_3$, $SiO_2$, and $TiO_2$.

An uppermost layer of the thin-film encapsulation layer E that is exposed to the outside may be an inorganic layer in order to prevent oxidation or moisture penetration into the OLED device 380.

In an exemplary embodiment, the thin film encapsulation layer E may include at least one sandwich structure where at least one organic layer is inserted between at least two inorganic layers. For example, the thin film encapsulation layer E may include a first inorganic layer, a first organic layer, and a second inorganic layer sequentially from the upper portion of the OLED device 380.

In an exemplary embodiment, the thin film encapsulation layer E may include a sandwich structure where at least one inorganic layer is inserted between at least two organic layers. For example, the thin film encapsulation layer E may include the first organic layer, the first inorganic layer, and a second organic layer sequentially from the upper portion of the OLED device 380.

In an exemplary embodiment, the thin film encapsulation layer E may include a sandwich structure where at least one organic layer is inserted between at least two inorganic layers and a sandwich structure where at least one inorganic layer is inserted between at least two organic layers. For example, the thin film encapsulation layer E may include the first inorganic layer, the first organic layer, the second inorganic layer, a second organic layer, and a third inorganic layer sequentially from the upper portion of the OLED device 380. In another example, the thin film encapsulation layer E may include the first inorganic layer, the first organic layer, the second inorganic layer, the second organic layer, the third inorganic layer, a third organic layer, and a fourth inorganic layer sequentially from the upper portion of the OLED device 380.

A halogenated metal layer including lithium fluoride (LiF) may be additionally included between the OLED device 380 and the first inorganic layer. The halogenated metal layer may prevent the OLED device 380 from being damaged when the first inorganic layer is formed by using a sputtering method.

The first organic layer may have a narrower area than the second inorganic layer, and the second organic layer may have a narrower area than the third inorganic layer.

According to the one or more exemplary embodiments, a deposition material may be precisely deposited on a substrate by increasing an adhesive force between the substrate and a mask frame assembly during a deposition process. However, the scope of the inventive concept is not limited to this effect.

One or more exemplary embodiments disclose a manufacturing process and a mask frame assembly that closely adheres a substrate and a mask to each other by increasing an adhesive force between the substrate and the mask. According to the one or more exemplary embodiments, a high-resolution organic light-emitting display of high display quality may be manufactured by reducing or removing a shadow effect created by the separation of the substrate and the mask during the manufacturing process.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask frame assembly, comprising:
a frame and a mask having a first surface that contacts the frame,
wherein the mask comprises:
an active area and pattern holes formed in the active area, the pattern holes being configured to allow a deposition material to pass through the mask;
a rib portion disposed outside the active area and configured to block the deposition material from passing through the mask;
reinforcing holes formed in the rib portion and passing through the rib portion; and
a non-magnetic reinforcing member disposed in the reinforcing holes and on a part of the rib portion.

2. The mask frame assembly of claim 1, wherein cross-sections of the pattern holes substantially correspond to cross-sections of the reinforcing holes.

3. The mask frame assembly of claim 1, wherein the non-magnetic reinforcing member is disposed to be equal to a depth of the reinforcing holes.

4. The mask frame assembly of claim 1, wherein the non-magnetic reinforcing member is disposed to have a thickness that is less than a depth of the reinforcing holes.

5. The mask frame assembly of claim 1, wherein the non-magnetic reinforcing member is disposed to have a thickness that is greater than a depth of the reinforcing holes.

6. The mask frame assembly of claim 5, wherein the non-magnetic reinforcing member is disposed to protrude to the first surface of the mask and to cover the part of the rib portion.

7. A mask frame assembly, comprising:
a frame and a mask having a first surface that contacts the frame,
wherein the mask comprises:
an active area and pattern holes formed in the active area, the pattern holes being configured to allow a deposition material to pass through the mask;
a rib portion disposed outside the active area and configured to block the deposition material from passing through the mask;
reinforcing grooves having a predetermined depth formed in the rib portion; and
a non-magnetic reinforcing member is disposed in at least one of the reinforcing grooves.

8. The mask frame assembly of claim 7, wherein the reinforcing grooves are formed in at least one of the first surface of the mask and a second surface of the mask opposite the first surface.

9. The mask frame assembly of claim 7, wherein the non-magnetic reinforcing member is disposed to be equal to the depth of the reinforcing grooves.

10. The mask frame assembly of claim 7, wherein the non-magnetic reinforcing member has a thickness that is less than the depth of the reinforcing grooves.

11. The mask frame assembly of claim 7, wherein the non-magnetic reinforcing member has a thickness that is greater than the depth of the reinforcing grooves.

12. The mask frame assembly of claim 11, wherein the reinforcing grooves are formed in the first surface of the mask.

13. The mask frame assembly of claim 12, wherein the non-magnetic reinforcing member protrudes to the first surface of the mask and to cover the part of the rib portion.

* * * * *